(12) United States Patent
Li et al.

(10) Patent No.: US 10,618,183 B2
(45) Date of Patent: Apr. 14, 2020

(54) ROBOT ARM HAVING AN ADJUSTABLE CARRYING SURFACE

(71) Applicants: BOE Technology Group Co., Ltd., Beijing (CN); Chongqing BOE Optoelectronics Technology Co., Ltd., Chongqing (CN)

(72) Inventors: Kaiqiang Li, Beijing (CN); Yang Yu, Beijing (CN); Jinwei Zhu, Beijing (CN); Yi Ouyang, Beijing (CN); Wujie Nan, Beijing (CN); Wensong Wang, Beijing (CN); Penggen Ding, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 103 days.

(21) Appl. No.: 15/959,436

(22) Filed: Apr. 23, 2018

(65) Prior Publication Data
US 2019/0039253 A1    Feb. 7, 2019

(30) Foreign Application Priority Data

Aug. 2, 2017 (CN) ................. 2017 2 0957380 U (51) Int. Cl.
*B25J 15/06* (2006.01)
*B25J 18/02* (2006.01)
(Continued)

(52) U.S. Cl.
CPC ....... *B25J 15/0616* (2013.01); *B25J 15/0061* (2013.01); *B25J 18/02* (2013.01);
(Continued)

(58) Field of Classification Search
CPC ... B25J 15/0616; B25J 18/02; H01L 21/3838; H01L 21/68707
(Continued)

(56) References Cited

U.S. PATENT DOCUMENTS

4,647,100 A * 3/1987 Lessway ................ B25J 15/028
294/119.1
5,374,147 A * 12/1994 Hiroki ............... H01L 21/68707
414/217
(Continued)

*Primary Examiner* — Paul T Chin
(74) *Attorney, Agent, or Firm* — Westman, Champlin & Koehler, P.A.

(57) ABSTRACT

A robot arm and a transfer robot are disclosed. In one embodiment, a robot arm includes an arm body and a plurality of adjustment units. The arm body has a first carrying surface and defines a length direction along which a length of the arm body is in and a width direction along which a width of the arm body is in. The adjustment units is disposed on at least one side of the arm body in the width direction. Each adjustment unit includes: a connection member fixed to the arm body, and an adjustment member movably connected to the connection member and having a second carrying surface that is parallel to the first carrying surface. The adjustment member is movable relative to the connection member in the width direction so that the second carrying surface is adjustable in the width direction.

17 Claims, 8 Drawing Sheets

(51) Int. Cl.
*H01L 21/687* (2006.01)
*H01L 21/683* (2006.01)
*B25J 15/00* (2006.01)
*H01L 21/67* (2006.01)

(52) U.S. Cl.
CPC .... H01L 21/6838 (2013.01); H01L 21/68707 (2013.01); *H01L 21/67259* (2013.01); *Y10S 901/27* (2013.01); *Y10S 901/40* (2013.01)

(58) Field of Classification Search
USPC ............................ 294/65, 185, 186, 188, 213
See application file for complete search history.

(56) References Cited

U.S. PATENT DOCUMENTS

| | | | | |
|---|---|---|---|---|
| 7,401,828 B2* | 7/2008 | Yang | .................... | B65G 49/061 294/119.1 |
| 8,356,849 B2* | 1/2013 | Shirasaki | .................... | B25J 1/00 294/119.1 |
| 8,696,042 B2* | 4/2014 | Rebstock | .......... | H01L 21/67017 294/119.1 |
| 8,770,640 B2* | 7/2014 | Kimura | ................ | B25J 15/0066 294/188 |
| 8,998,561 B2* | 4/2015 | Furuya | ................. | B25J 11/0095 414/744.8 |
| 2002/0071756 A1* | 6/2002 | Gonzalez | ........... | H01L 21/68707 294/213 |
| 2002/0197139 A1* | 12/2002 | Chinbe | ............. | H01L 21/67766 414/416.03 |
| 2004/0086368 A1* | 5/2004 | Downs | ................. | B25J 15/0253 414/741 |
| 2004/0113444 A1* | 6/2004 | Blonigan | .......... | H01L 21/68707 294/213 |
| 2005/0017529 A1* | 1/2005 | Rogers | ................... | B25J 13/085 294/103.1 |
| 2005/0129496 A1* | 6/2005 | Heiland | ............ | H01L 21/68707 414/744.1 |
| 2005/0285419 A1* | 12/2005 | Matsumoto | ....... | H01L 21/67742 294/213 |
| 2006/0157998 A1* | 7/2006 | Gershenzon | ...... | H01L 21/68707 294/103.1 |
| 2013/0164113 A1* | 6/2013 | Lada | .................. | H01L 21/67742 414/806 |
| 2017/0368692 A1* | 12/2017 | Alonso Ramila | .... | B25J 15/0061 |
| 2018/0264660 A1* | 9/2018 | Bergeron | .................. | B25J 15/08 |

* cited by examiner

ROBOT ARM HAVING AN ADJUSTABLE CARRYING SURFACE

CROSS-REFERENCE TO RELATED APPLICATION

This application claims priority to Chinese Patent Application No. 201720957380.7 filed on Aug. 2, 2017 in the State Intellectual Property Office of China, the disclosure of which is hereby incorporated by reference in its entirety.

TECHNICAL FIELD

The present disclosure relates to the field of manufacturing of display panel, and particularly, to a robot arm and a transfer robot.

BACKGROUND

Substrates for display panel are transferred to different production lines through a transfer robot in the production process of the display panel at present. This transfer robot is provided with a plurality of suckers at a robot arm thereof, and these suckers form a carrying surface of the robot arm. Substrate is adsorbed onto the robot arm through these suckers, so that the transfer robot can carry the substrate to the production line.

SUMMARY

According to an aspect of the present disclosure, there is provided a robot arm, comprising: an arm body having a first carrying surface and defining a length direction along which a length of the arm body is in and a width direction along which a width of the arm body is in; and a plurality of adjustment units disposed on at least one side of the arm body in the width direction; wherein, each of the plurality of adjustment units comprises: a connection member fixed to the arm body, and an adjustment member movably connected to the connection member and having a second carrying surface that is parallel to the first carrying surface; and wherein, the adjustment member is movable relative to the connection member in the width direction so that the second carrying surface is adjustable in the width direction.

In some embodiments, the adjustment member is movable relative to the connection member such that, the second carrying surface of the adjustment member is adjustable in the width direction between a series of positions from a position where the second carrying surface is within the arm body to a position where the second carrying surface is protruded out of the arm body.

In some embodiments, the plurality of adjustment units are disposed at both sides of the arm body in the width direction, respectively.

In some embodiments, the connection member comprises an adjustment rail fixed to the arm body, the adjustment member comprises an adjustment block, and the adjustment block is engaged with the adjustment rail and is slidable along the adjustment rail.

In some embodiments, the adjustment block is provided with a sliding groove which matches in shape with the adjustment rail and through which the adjustment block is engaged with the adjustment rail.

In some embodiments, the adjustment rail has a cross section of inverted isosceles trapezoidal shape, and the sliding groove is a dovetail groove matching with the adjustment rail.

In some embodiments, the adjustment block comprises a plurality of engagement recesses distributed at intervals in a bottom surface of the sliding groove in the width direction.

In some embodiments, the arm body further comprises a limiting member, the limiting member has one end fixed to the arm body and the other end acted as a free end, and, the free end is engaged with one of the plurality of engagement recesses when the adjustment block is moved to a preset position, to limit a position of the adjustment block on the adjustment rail.

In some embodiments, the adjustment block further comprises a guide slide way provided in the bottom surface of the sliding groove in the width direction and communicated with the plurality of engagement recesses, aperture size of the guide slide way is less than aperture size of the engagement recesses, and the free end abuts against the guide slide way during movement of the adjustment block.

In some embodiments, the limiting member comprises a ball and a spring, and the spring has one end fixed to the arm body and the other end fixed to the ball.

In some embodiments, the robot arm further comprises: a plurality of first sucker elements provided at intervals on both edges of the first carrying surface in the width direction, respectively; and a plurality of second sucker elements provided at intervals on edges, away from the first carrying surface, of the second carrying surfaces of the adjustment members of the plurality of the adjustment units, respectively.

In some embodiments, the first sucker elements and the second sucker elements are sucking discs.

In some embodiments, the first carrying surface and the second carrying surface each has a rectangular shape.

In some embodiments, the robot arm further comprises: positioning rods provided at both edges of the first carrying surface in the width direction, respectively, and extending on the arm body in the length direction, and each having a plurality of spaces distributed therein at intervals; wherein, the plurality of spaces are in a one-to-one correspondence with the plurality of adjustment units so that the plurality of adjustment units are disposed in the plurality of spaces, respectively.

In some embodiments, in each of the plurality of adjustment units, two protruding elements are provided at one end of the adjustment block close to the first carrying surface in the length direction; receiving slits are provided respectively on both sides of each of the plurality of spaces of the positioning rod and match in shape with the two protruding elements and are communicated with the each of the plurality of spaces; and the protruding elements are moveably engaged in the receiving slits when the adjustment block moves in the space.

In some embodiments, the positioning rods each further comprise a plurality of first sheet elements distributed at intervals, a plane in which the plurality of first sheet elements are in is parallel to the first carrying surface, the plurality of first sheet elements each are provided with at least one of the first sucker elements, the plurality of spaces are provided respectively between every two adjacent ones of the plurality of first sheet elements, and the plurality of first sheet elements each are provided with one of the receiving slits near the space; and the adjustment blocks each further comprise a second sheet element, a plane in which the second sheet element is in is parallel to the second carrying surface, the second sheet element is provided at an edge, away from the first carrying surface, of the second carrying surface of the adjustment block, and the second sheet element is provided with at least one of the second sucker elements.

In some embodiments, the first sheet element is formed with a first connection hole and a first vent hole communicated with the first connection hole, and the first sucker element is disposed on the first sheet element through the first connection hole; and the second sheet element is formed with a second connection hole, and the adjustment block is formed with a second vent hole communicated with the second connection hole, and the second sucker element is disposed on the second sheet element through the second connection hole.

In some embodiments, the first connection hole and the second connection hole each are connected with a sucker element connector; the first sucker element is connected to the first connection hole through the sucker element connector; the second sucker element is connected to the second connection hole through the sucker element connector; and the first vent holes and the second vent holes each are connected with a vent connector, and the vent connectors are communicated with one another.

In some embodiments, the robot arm further comprises: a sensor base disposed on the arm body and configured for placement of a sensor for sensing location of a substrate during operation of the robot arm.

According to another aspect of the present disclosure, there is provided a transfer robot comprising at least one robot arm according to any of abovementioned embodiments.

BRIEF DESCRIPTION OF THE DRAWINGS

In order to provide a more clear explanation of solutions according to embodiments of the present disclosure, there is provided a brief introduction of the attached drawings used in the following description of the embodiments. Obviously, the drawings mentioned in the following description belong to some embodiments of the present disclosure. However, for those skilled in the art, other drawings may be achieved on the basis of these attached drawings without involving any inventive steps.

FIG. 6b is a partial enlarged view of the portion B of the arm body shown in FIG. 6a;

DETAILED DESCRIPTION OF THE EMBODIMENTS

In order to provide a more clear understanding of objects, technique solutions and advantages of the present disclosure, the present disclosure will be further described hereinafter in detail in conjunction with embodiments and with reference to the attached drawings.

Figure 1:
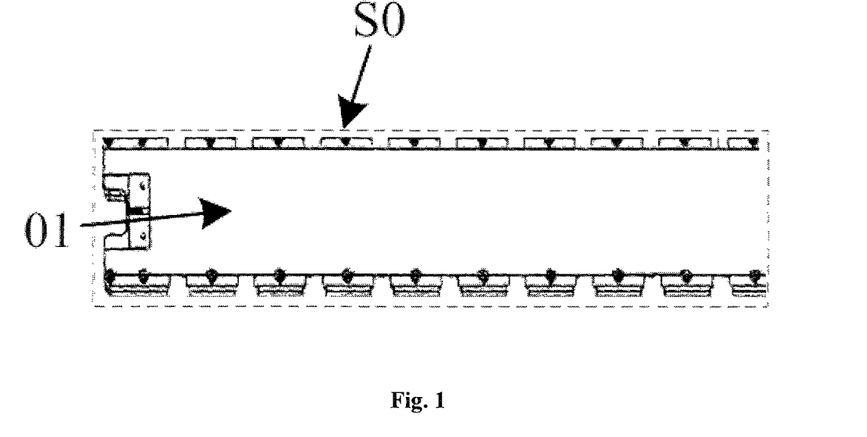
FIG. 1 is a schematic view showing a structure of a robot arm in related art.

Please refer to FIG. 1, FIG. 1 is a schematic view showing a structure of a robot arm in related art. The robot arm 01 has a carrying surface S0 with constant area, which causes this robot arm is able to transfer only a substrate with fixed size that match the constant area of the carrying surface S0, and thereby results in poor flexibility of use of a transfer robot having such robot arm.

According to embodiments of the present disclosure, there are provided a robot arm and a transfer robot, which can improve flexibility of use of the transfer robot to some extent.

According to a technical concept of the present disclosure, there is provided a robot arm comprising an arm body and a plurality of adjustment units. The arm body has a first carrying surface, and the arm body defines a length direction along which a length of the arm body is in and a width direction along which a width of the arm body is in. The plurality of adjustment units are disposed on at least one side of the arm body in the width direction. Each adjustment unit comprises a connection member and an adjustment member, the connection member is fixed to the arm body, the adjustment member is movably connected to the connection member, and the adjustment member has a second carrying surface that is parallel to the first carrying surface. The adjustment member is movable relative to the connection member in the width direction so that the second carrying surface is adjustable in the width direction.

Figure 2:
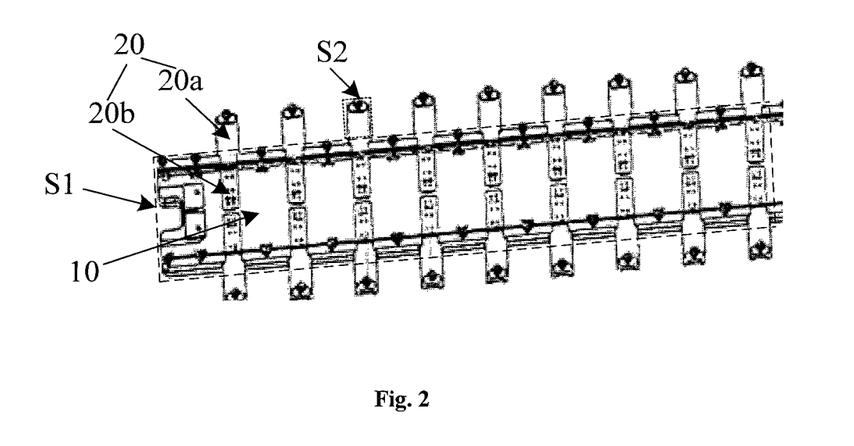
FIG. 2 is a schematic view showing a structure of a robot arm according to an embodiment of the present disclosure.
Figure 3:
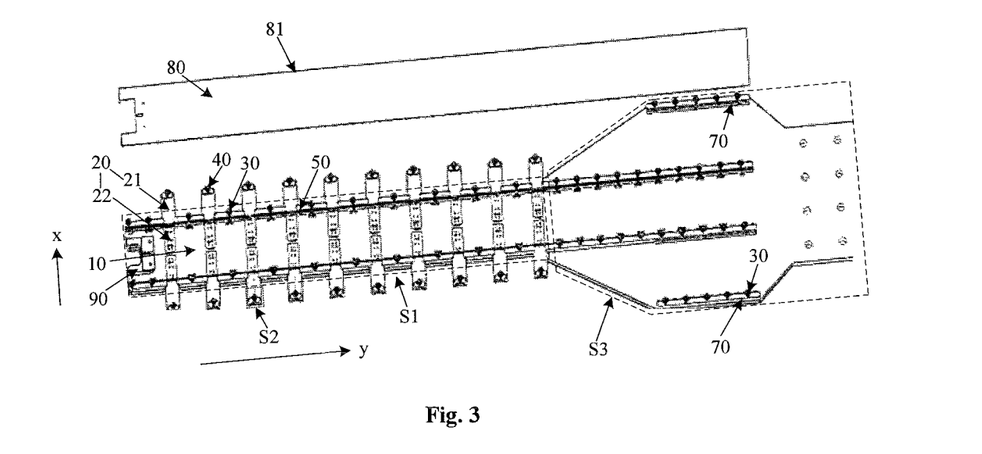
FIG. 3 is another schematic view showing the structure of the robot arm according to the embodiment of the present disclosure.

According to an embodiment of the present disclosure, there is provided a robot arm. Please refer to FIG. 2 and FIG. 3, FIG. 2 is a schematic view showing a structure of a robot arm according to an embodiment of the present disclosure; and FIG. 3 is another schematic view showing the structure of the robot arm according to the embodiment of the present disclosure.

The robot arm comprises an arm body 10 and a plurality of adjustment units 20. The arm body 10 has a first carrying surface S1, and the arm body 10 defines a length direction y along which a length of the arm body 10 is in and a width direction x along which a width of the arm body 10 is in.

The plurality of adjustment units 20 are respectively disposed on both sides of the arm body 10 in the width direction. Each adjustment unit 20 may comprise an adjustment member 20a and a connection member 20b, the connection member 20b is fixed to the arm body 10, the adjustment member 20a is movably connected to the connection member 20b, and the adjustment member 20a has a second carrying surface S2 that is parallel to the first carrying surface S1.

The adjustment member 20a is movable relative to the connection member 20b in the width direction x so that the second carrying surface S2 is adjustable in the width direction x.

In the embodiment of the present disclosure, as shown in FIG. 2 and FIG. 3, the adjustment member 20a is movable relative to the connection member 20b such that, the second carrying surface S2 of the adjustment member 20a is adjustable in the width direction x between a series of positions from a position where the second carrying surface S2 is within the arm body 10 to a position where the second carrying surface S2 is protruded out of the arm body 10. When the second carrying surface S2 of the adjustment member 20a is adjusted in the width direction x between a position where the second carrying surface S2 is completely within the arm body 10 and a position where the second carrying surface S2 is completely protruded out of the arm body 10, an overlapping area between an orthogonal projection of the second carrying surface S2 of the adjustment member 20a onto the first carrying surface S1 of the arm body 10 and the first carrying surface S1 of the arm body 10 is increased or decreased. Specifically, when the second carrying surface S2 of the adjustment member 20a is adjusted gradually towards the position where the second carrying surface S2 is completely within the arm body 10, the overlapping area between the orthogonal projection of the second carrying surface S2 onto the first carrying surface S1 and the first carrying surface S1 is increased gradually. When the second carrying surface S2 of the adjustment member 20a is adjusted gradually towards the position where the second carrying surface S2 is completely protruded out of the arm body 10, the overlapping area between the orthogonal projection of the second carrying surface S2 onto the first carrying surface S1 and the first carrying surface S1 is decreased gradually. In this way, a total carrying surface of the robot arm is adjustable, and thus the robot arm can carry substrates with different sizes, which effectively improve flexibility of use of the transfer robot having the robot arm.

In at least some embodiments, as shown in FIG. 3, the connection member comprises an adjustment rail 22 fixed to the arm body 10, and the adjustment member comprises an adjustment block 21. The adjustment block 21 is engaged with the adjustment rail 22, and is slidable along the adjustment rail 22, to change the carrying surface of the robot arm.

It should be noted that, in the embodiment shown in FIG. 3, both the first carrying surface S1 and the second carrying surfaces S2 are of rectangular shape. However, in other embodiments, other different shapes may be adopted.

Figure 4:
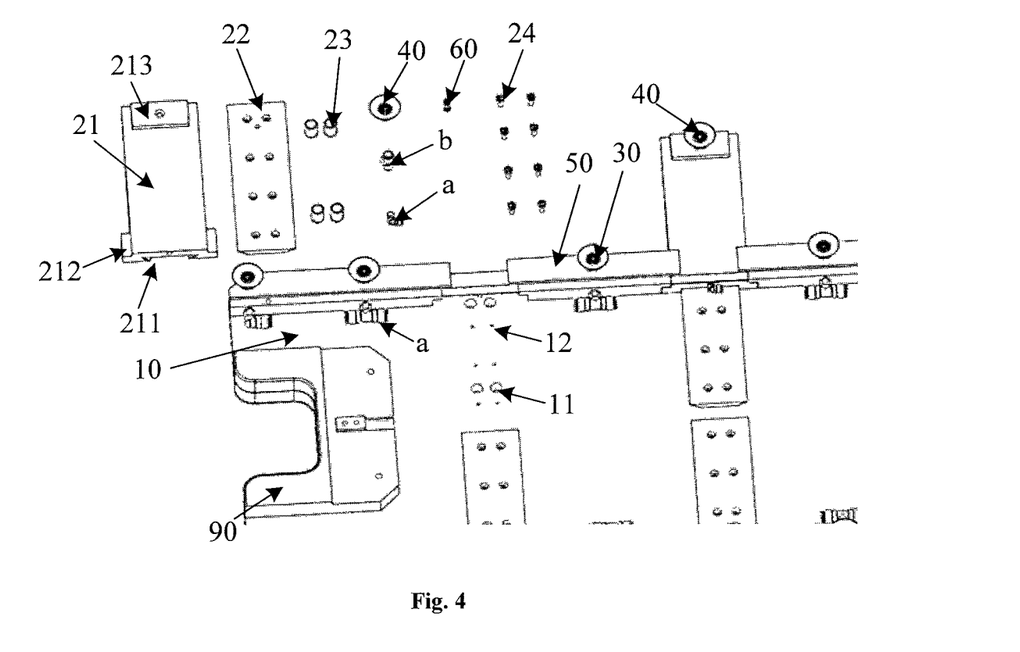
FIG. 4 is an explosive view showing a structure of a part of the robot arm shown in FIG. 3.

According to embodiments of the present disclosure, in order to more clearly illustrate a positional relationship between the adjustment block and the adjustment rail, please refer to FIG. 4, FIG. 4 is an explosive schematic view showing a structure of a part of the robot arm shown in FIG. 3. The adjustment block 21 is provided with a sliding groove 211 which matches in shape with the adjustment rail 22, and the adjustment block 21 is engaged with the adjustment rail 22 through the sliding groove 211. In the shown embodiments, the adjustment rail 22 has a cross section of inverted isosceles trapezoidal shape. The cross section is perpendicular to both the length direction y and the width direction x of the arm body 10. And, the sliding groove 211 is a dovetail groove matching with the adjustment rail 22.

Figure 5A:
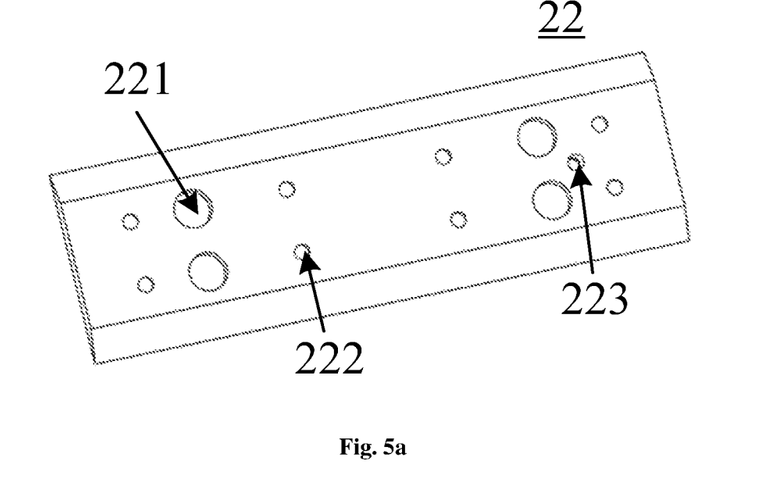
FIG. 5a is a schematic view showing a structure of an adjustment rail in the robot arm according to the embodiment of the present disclosure.
Figure 5B:
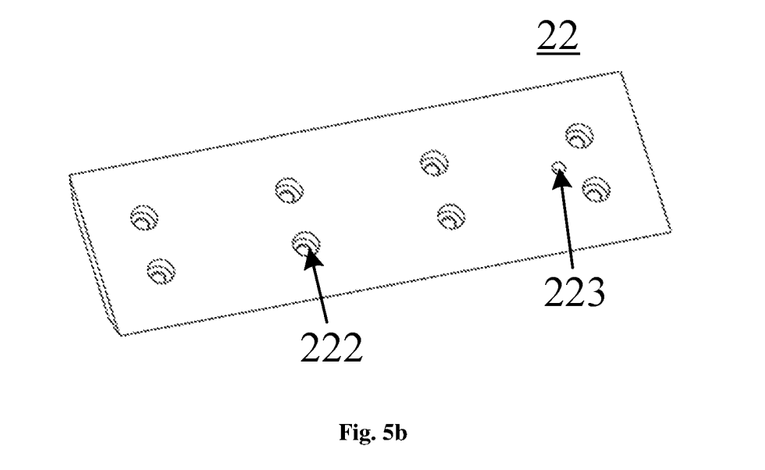
FIG. 5b is another schematic view showing the structure of the adjustment rail in the robot arm according to the embodiment of the present disclosure.
Figure 6A:
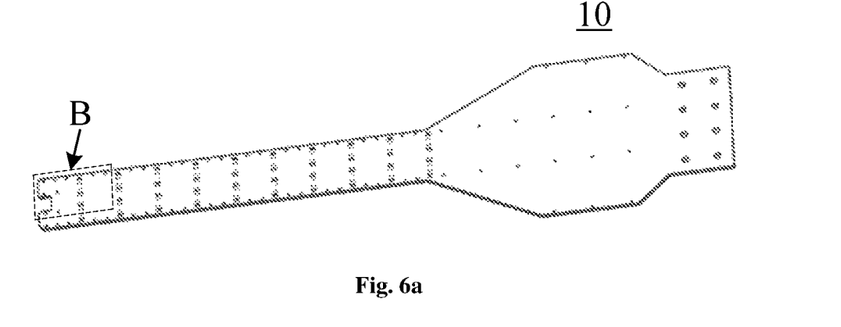
FIG. 6a is a schematic view showing a structure of an arm body in the robot arm according to the embodiment of the present disclosure.
Figure 6B:
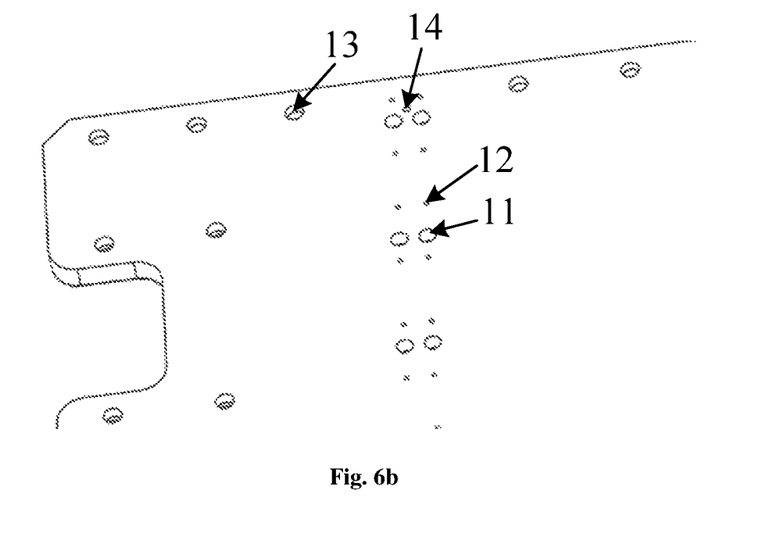

In at least some embodiments, refer to FIG. 4 mentioned as well as FIG. 5a to FIG. 6b, FIG. 5a is a schematic view showing a structure of an adjustment rail in the robot arm according to the embodiment of the present disclosure; FIG. 5b is another schematic view showing the structure of the adjustment rail in the robot arm according to the embodiment of the present disclosure; FIG. 6a is a schematic view showing a structure of an arm body in the robot arm according to the embodiment of the present disclosure; and FIG. 6b is a partial enlarged view of the portion B of the arm body shown in FIG. 6a. The adjustment unit 20 further comprises a key 23 and a bolt 24, the adjustment rail 22 is formed with a first key way 221 and a first bolt hole 222, and the arm body 10 is formed with a second key way 11 and a second bolt hole 12. The adjustment rail 22 is positioned to the arm body 10 by inserting the key 23 into the first key way 221 and the second key way 11. The adjustment rail 22 is fixed to the arm body 10 by fastening the bolt 24 into the first bolt hole 222 and the second bolt hole 12. It should be noted that, FIG. 5a to FIG. 6b clearly illustrate positional relationships between the first key way 221 and the first bolt hole 222 and between the second key way 11 and the second bolt hole 12.

According to embodiments of the present disclosure, as shown in FIG. 3 and FIG. 4, the robot arm may further comprise: a plurality of first sucker elements 30 and a plurality of second sucker elements 40. The plurality of first sucker elements 30 are provided at intervals on both edges of the first carrying surface S1 in the width direction x, respectively. The plurality of second sucker elements 40 are provided at intervals on edges, away from the first carrying surface S1, of the second carrying surfaces S2 of the adjustment members 20a of the plurality of the adjustment units 20, respectively. In at least some embodiments, both the first sucker elements 30 and the second sucker elements 40 may be sucking discs. With provisions of the first sucker elements 30 on the first carrying surface S1 and provisions of the second sucker elements 40 on the second carrying surface S2, the robot arm can effectively carry a substrate and prevent the substrate from falling off from the robot arm.

Figure 7:
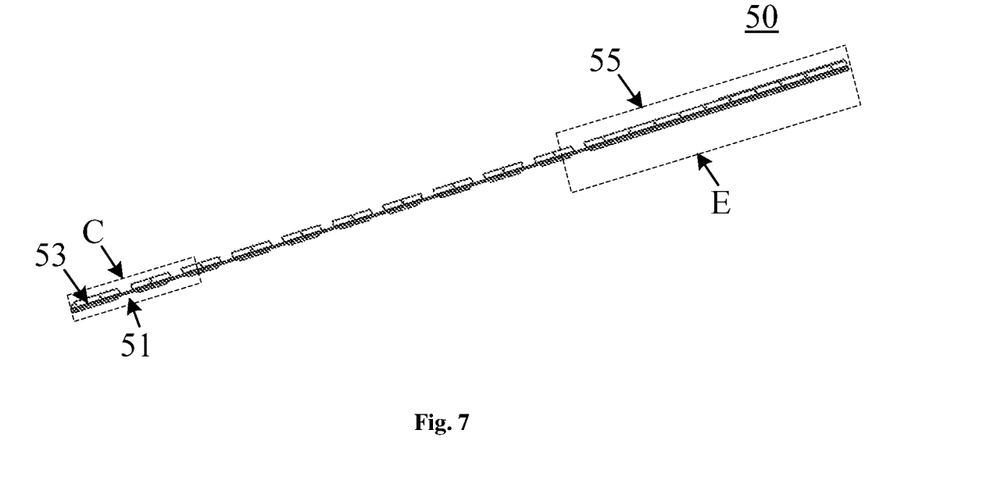
FIG. 7 is a schematic view showing a structure of a positioning rod in the robot arm according to the embodiment of the present disclosure.
Figure 8A:
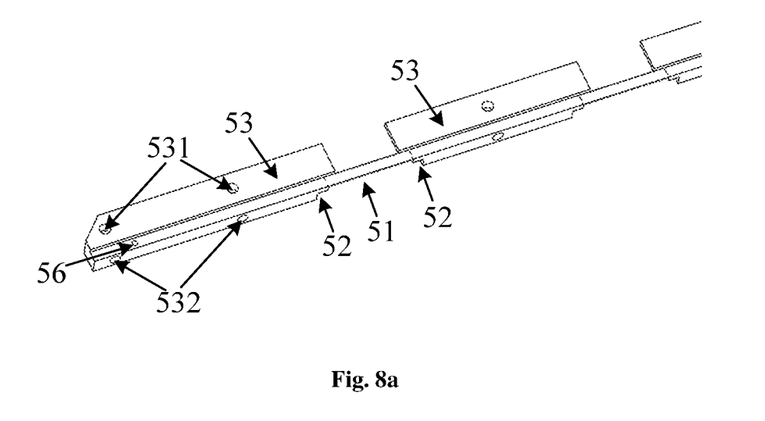
FIG. 8a is a partial enlarged view of the portion C of the positioning rod shown in FIG. 7.
Figure 8B:
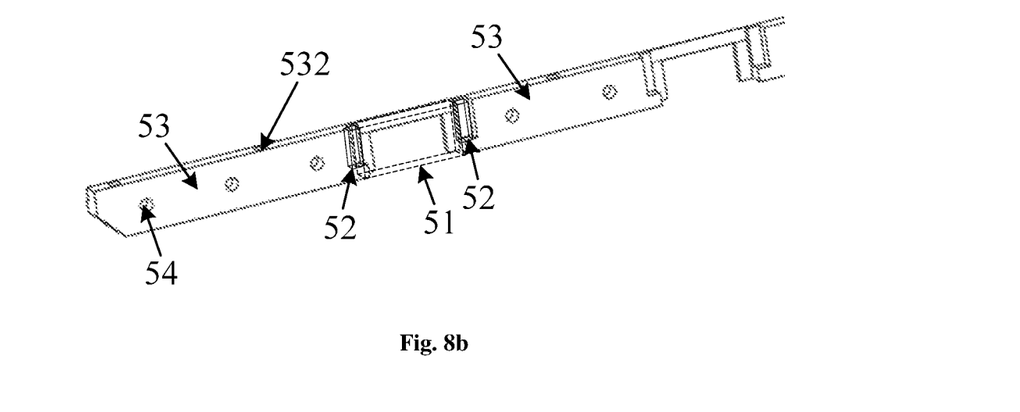
FIG. 8b is another partial enlarged view of the portion C of the positioning rod shown in FIG. 7.

According to embodiments of the present disclosure, as shown in FIG. 3 and FIG. 4, the robot arm may further comprise positioning rods 50 provided at both edges of the first carrying surface S1 in the width direction x, respectively. Please refer to FIG. 7 and FIGS. 8a to 8b, FIG. 7 is a schematic view showing a structure of a positioning rod in the robot arm according to the embodiment of the present disclosure; FIG. 8a is a partial enlarged view of the portion C of the positioning rod shown in FIG. 7; and FIG. 8b is another partial enlarged view of the portion C of the positioning rod shown in FIG. 7. Each positioning rod 50 extends on the arm body 10 in the length direction y, and each positioning rod 50 has a plurality of spaces 51 distributed therein at intervals. The plurality of spaces 51 distributed at intervals are in a one-to-one correspondence with the plurality of adjustment units 20 so that the plurality of adjustment units 20 are disposed in the plurality of spaces 51, respectively. In this way, the second carrying surface S2 of the adjustment member 20a of each adjustment unit 20 is movable in the width direction x between a series of positions from a position where the second carrying surface S2 is completely within the arm body 10 to a position where the second carrying surface S2 is completely protruded out of the arm body 10, so as to vary size of a total carrying surface of the robot arm. It should be noted that, FIG. 8a and FIG. 8b clearly illustrate positional relationships of the spaces 51 in the positioning rod 50.

Figure 9A:
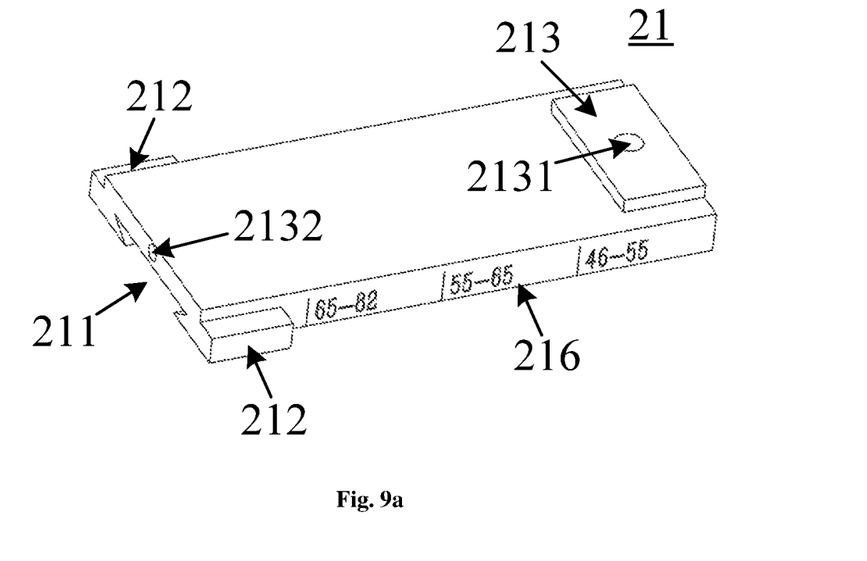
FIG. 9a is a schematic view showing a structure of an adjustment block in the robot arm according to the embodiment of the present disclosure.
Figure 9B:
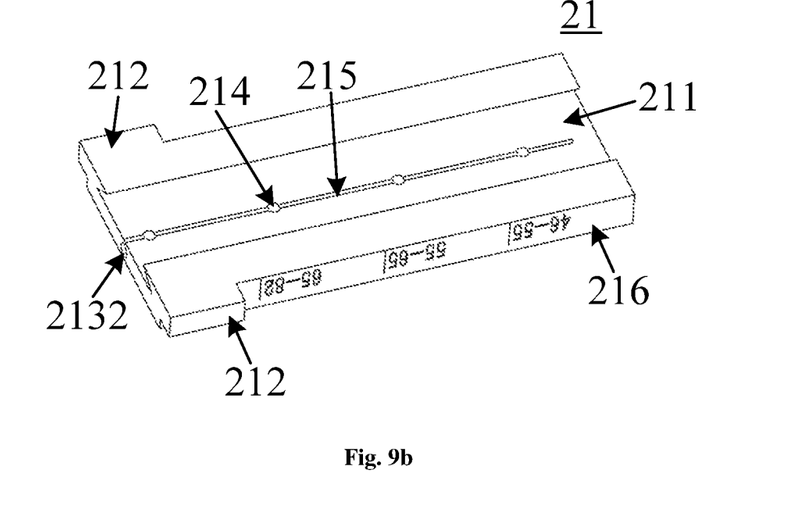
FIG. 9b is another schematic view showing the structure of the adjustment block in the robot arm according to the embodiment of the present disclosure.

In the embodiment of the present disclosure, refer to FIG. 4, in each adjustment unit, two protruding elements 212 are provided at one end of the adjustment block 21 close to the first carrying surface S1 in the length direction. Please refer to FIG. 9a and FIG. 9b, FIG. 9a is a schematic view showing a structure of an adjustment block in the robot arm according to the embodiment of the present disclosure, and FIG. 9b is another schematic view showing the structure of the adjustment block in the robot arm according to the embodiment of the present disclosure. In the positioning rod 50, receiving slits 52 are provided respectively in both sides of each space 51, and match in shape with the two protruding elements 212, and are communicated with the each space 51. The receiving slit 52 has an opened end and a closed end opposite to the opened end. The two protruding elements 212 are moveably engaged in the receiving slits 52 from the opened end when the adjustment block 21 moves in the each space 51, thereby preventing the adjustment block 21 from falling off from the robot arm.

In at least some embodiments, as shown in FIG. 3 and FIG. 8a to FIG. 8b, each positioning rod 50 may further comprise a plurality of first sheet elements 53 distributed at intervals, a plane in which the plurality of first sheet elements 53 are in is parallel to the first carrying surface S1, each first sheet element 53 is provided with at least one of the first sucker elements 30, one space 51 is provided between every two adjacent ones of the plurality of first sheet elements 53, and each first sheet element 53 is provided with one receiving slit 52 near the space 51. Meanwhile, as shown in FIG. 9a and FIG. 9b, the adjustment block 21 may further comprise a second sheet element 213, a plane in which the sheet element 213 is in is parallel to the second carrying surface S2, the second sheet element 213 is provided at the edge, away from the first carrying surface S1, of the second carrying surface S2 of the adjustment block 21, and the second sheet element 213 is provided with at least one of the second sucker elements 40. It should be noted that, FIG. 9a and FIG. 9b clearly illustrate positional relationships of the protruding elements 212 in the adjustment block 21, and of the second sheet element 213 in the adjustment block 21.

In at least some embodiments, as shown in FIG. 8a to FIG. 8b, the first sheet element 53 is formed with a first connection hole 531 and a first vent hole 532 communicated with the first connection hole 531, and the first sucker element 30 is disposed on the first sheet element 53 through the first connection hole 531. The first sucker element 30 obtains an adsorption capability when performing an air suction to the first vent hole 532. Meanwhile, as shown in FIG. 9a to FIG. 9b, the second sheet element 213 is formed with a second connection hole 2131, and the adjustment block 21 is formed with a second vent hole 2132 communicated with the second connection hole 2131, and the second sucker element 40 is disposed on the second sheet element 213 through the second connection hole 2131. The second sucker element 40 obtains an adsorption capability when performing an air suction to the second vent hole 2132. In at least some embodiments, as shown in FIG. 4, the first connection hole 531 and the second connection hole 2131 each is connected with a sucker element connector b, and the first sucker element 30 is connected to the first connection hole 531 through the sucker element connector b, the second sucker element 40 is connected to the second connection hole 2131 through the sucker element connector b; and the first vent hole 532 and the second vent hole 2132 each is connected with a vent connector a, and the vent connectors a are communicated with one another via vent tube, so that it can be achieved that both the first sucker element 30 and the second sucker element 40 own adsorption capability or desorption capability simultaneously.

In at least some embodiments, as shown in FIG. 6b and FIG. 8b, the arm body 10 is formed with a third bolt hole 13, and the positioning rod 50 is formed with a fourth bolt hole 54. The positioning rod 50 is fixed to the arm body 10 by fastening a screw into the third bolt hole 13 and the fourth bolt hole 54.

According to embodiments of the present disclosure, as shown in FIG. 4, the adjustment block 21 may further comprise a plurality of engagement recesses 214. Regarding structure of the engagement recesses 214, refer to FIG. 9b, a plurality of engagement recesses 214 are distributed at intervals in a bottom surface of the sliding groove 211 in an extension direction of the sliding groove 211, and the extension direction of the sliding groove 211 is parallel to an extension direction of the connection member 20b, that is, the extension direction of the sliding groove 211 is parallel to the width direction x of the arm body 10. According to embodiments of the present disclosure, as shown in FIG. 9b, the adjustment block 21 may further comprise a guide slide way 215, the guide slide way 215 is provided in the bottom surface of the sliding groove 211 in the extension direction of the sliding groove 211 (namely the width direction x), the guide slide way 215 is communicated with the plurality of engagement recesses 214, aperture size of the guide slide way 215 is less than aperture size of the engagement recess 214, an extension direction of the guide slide way 215 and an extension direction of the engagement recess 214 are parallel to each other, and both are parallel to the width direction x of the arm body 10. According to embodiments of the present disclosure, as shown in FIG. 4, the arm body 10 may further comprise a limiting member 60. The limiting member 60 has one end fixed to the arm body 10 and the other end acted as a free end. During the movement of the adjustment block 21, a relative movement occurs between the free end of the limiting member 60 and the bottom surface of the sliding groove 211. When the adjustment block 21 is moved to a preset position, the free end is engaged with one of the plurality of engagement recesses 214, to limit a position of the adjustment block 21 on the adjustment rail 22, that is to limit a distance between the second sucker elements 40 of the adjustment block 21 and the arm body 10, so as to eliminate changing of the distance between the second sucker elements 40 and the arm body 10 during operation of the robot arm.

Figure 10:
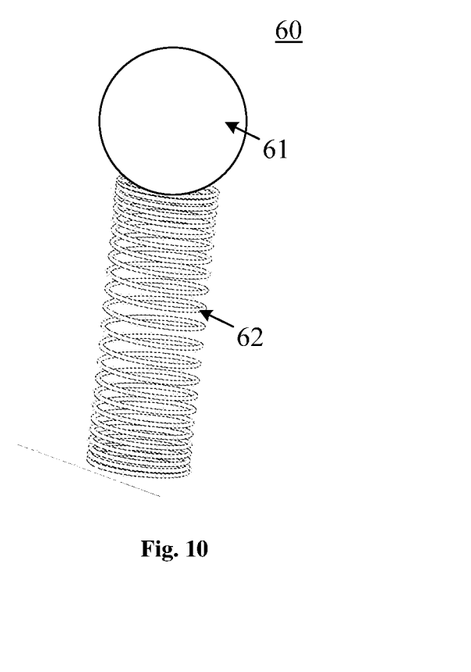
FIG. 10 is a schematic view showing a structure of a limiting member in the robot arm according to the embodiment of the present disclosure.

Please refer to FIG. 10, FIG. 10 is a schematic view showing a structure of a limiting member in the robot arm according to the embodiment of the present disclosure. As shown in FIG. 10, the limiting member 60 may comprise a ball 61 and a spring 62, and one end of the spring 62 is fixed to the arm body 10, and the other end is acted as a free end for placement of the ball 61. In at least some embodiments, the engagement recess may be a hemispherical recess matching in shape with the ball 61, one end of the spring 62 is fixed to the arm body 10 and passes through a through hole (namely, through hole 223 shown in FIG. 5a and FIG. 5b) of the adjustment rail. The other end of the spring 62 is fixed to the ball 61 and is acted as the free end of the limiting member. In at least some embodiments, as shown in FIG. 9b, a depth of the engagement recess 214 is greater than that of a guide slide way 215. The ball 61 abuts against the guide slide way 215 during movement of the adjustment block 21, and, when the ball 61 is aligned with a certain engagement recess 214, the ball 61 is forced under the action of an elastic force of the spring 62 into the certain engagement recess 214 so as to be engaged into the certain engagement recess 214. At this moment, the distance between the second sucker element and the arm body is determined. When the adjustment block 21 continues to move under the action of external force, the ball 61 is disengaged from the certain engagement recess 214 and continues to abut against the guide slide way 215.

According to embodiments of the present disclosure, as shown in FIG. 6b, the arm body 10 is formed with a mount hole 14. As shown in FIG. 5a or 5b, the adjustment rail 22 is formed with a through hole 223. One end of the limiting member 60 is fixed to the mount hole 14 of the arm body 10, and passes through the through hole 223 of the adjustment rail 22. In this way, during movement of the adjustment block 21, the other end (namely the free end) of the limiting member 60 abuts against the guide slide way 215, so that a relative movement occurs between the free end of the limiting member 60 and the guide slide way 215, that is, the free end of the limiting member 60 only moves in the guide slide way 215, which improves accuracy of determination of the distance between the second sucker element and the arm body.

According to embodiments of the present disclosure, in order to ensure that the limiting member determines accurately the distance between the second sucker element and the arm body, scale marks may be provided on the adjustment block in the extension direction of the sliding groove. For example, as shown in FIG. 9a or FIG. 9b, scale marks 216 are provided at at least one side face of the adjustment block 21. Since the adjustment block 21 has a symmetrical structure which is mirror-symmetrical about a section of the adjustment block, the at least one side face of the adjustment block 21 is at least one of the two side faces of the adjustment block 21 which are mirror-symmetrical about the section of the adjustment block.

Figure 11A:
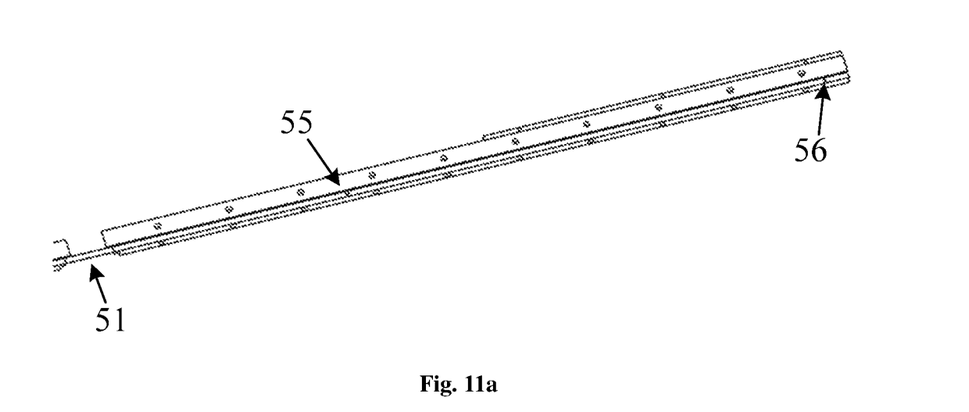
FIG. 11a is a partial enlarged view of the portion E of the positioning rod shown in FIG. 7.
Figure 11B:
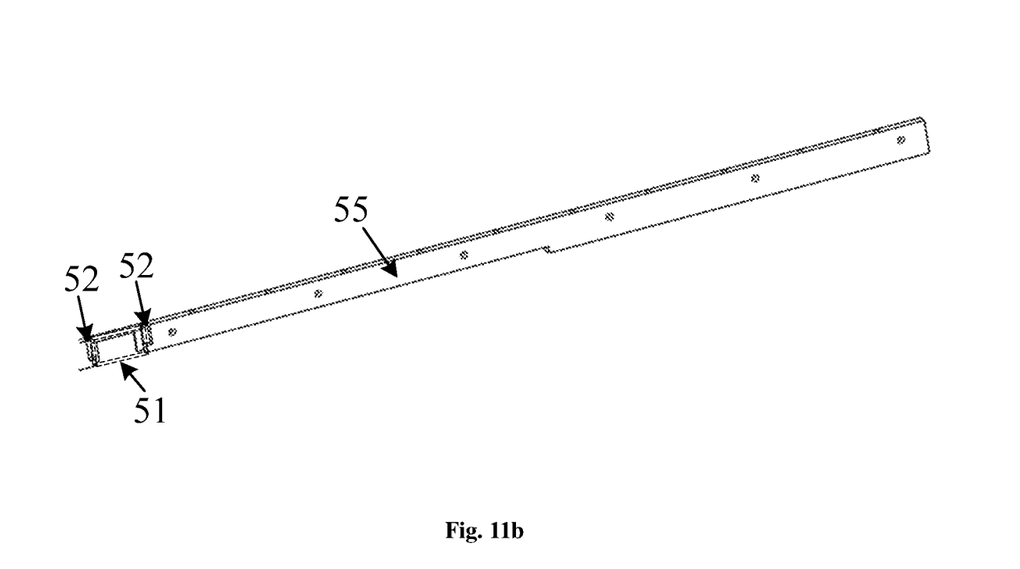
FIG. 11b is another partial enlarged view of the portion E of the positioning rod shown in FIG. 7.

According to embodiments of the present disclosure, please refer to FIG. 3, the arm body 10 further comprises a third carrying surface S3, and a width of the first carrying surface S1 is smaller than that of the third carrying surface S3. Since the width of the first carrying surface S1 is small, the carrying surface of the robot arm in the width direction can be increased by provision of the plurality of adjustment units 20 on the first carrying surface S1. In at least some embodiments, refer to FIG. 7 and FIG. 11a to FIG. 11b, FIG. 11a is a partial enlarged view of the portion E of the positioning rod shown in FIG. 7; and FIG. 11b is another partial enlarged view of the portion E of the positioning rod shown in FIG. 7. The first sheet elements 53 of the positioning rod 50 is within the first carrying surface S1, and the positioning rod 50 may further comprise a third sheet element 55 provided within the third carrying surface S3. The third sheet element 55 is provided with a plurality of first sucker elements 30. One space 51 is formed between the third sheet element 55 and one first sheet element 53 adjacent thereto. A receiving slit 52 is formed in the third sheet element 55 near the space 51. It should be noted that, FIG. 11a and FIG. 11b clearly illustrate positional relationship of the third sheet element 55 on the positioning rod 50.

According to embodiments of the present disclosure, please refer to FIG. 3, the robot arm may further comprise a secondary positioning rod 70 provided on the third carrying surface S3 of the arm body 10 and having a plurality of first sucker elements 30 thereon.

According to embodiments of the present disclosure, please refer to FIG. 3, the robot arm may further comprise a cover plate 80. As shown in FIG. 8a and FIG. 11a, the positioning rod 50 is formed with a fifth bolt hole 56, and the cover plate 80 is formed with a sixth bolt hole 81. The cover plate 80 is fixed to the arm body 10 by fastening a screw into the fifth bolt hole 56 and the sixth bolt hole 81.

According to embodiments of the present disclosure, please refer to FIG. 3 and FIG. 4, the robot arm may further comprise a sensor base 90 disposed on the arm body 10 and configured for placement of a sensor for sensing location of a substrate during operation of the robot arm.

Concerning the above, a robot arm is provided according to embodiments of the present disclosure. The robot arm comprises an arm body and a plurality of adjustment units. Each adjustment unit comprises a connection member and an adjustment member, the connection member is fixed to the arm body, the adjustment member is movably connected to the arm body through the connection member, and the adjustment member is movable relative to the connection member in the width direction so that the second carrying surface is adjustable in the width direction. Thereby, the total carrying surface of the robot arm is adjustable. In this way, the robot arm can be used to carry substrates of different sizes, which effectively improve flexibility of use of the transfer robot having the robot arm.

According to embodiments of the present disclosure, there is provided a transfer robot comprising at least one robot arm according to any one of the abovementioned embodiments, for example, the one shown in FIG. 2 or FIG. 3. In some embodiment, there may be one, two or four robot arm(s) in the transfer robot.

In some embodiments, the transfer robot may further comprise a movable robot body, and the robot arm is provided on the movable robot body.

In related art, the robot arm of a transfer robot has a carrying surface with constant area. When such transfer robot is used to carry a substrate with smaller thickness, a part of the substrate that is not in contact with the robot arm is prone to deform severely, so that the substrate cannot be processed no longer.

According to the embodiments of the present disclosure, a worker firstly measures size (which may include a length, a width and a thickness) of a substrate to be transferred by the transfer robot, then, calculates, according to the size of the substrate, quantity of the adjustment units required to be moved in the robot arm of the transfer robot, as well as the distance between the second sucker element and the arm body, and finally, pulls the adjustment blocks of the adjustment units out of the arm body to adjust a size of a total carrying surface of the robot arm. In this way, the robot arm can carry substrates with different sizes.

The abovementioned embodiments of the present disclosure are exemplary, and are not used to limit the present disclosure. All of changes, equivalent alternatives, improvements, made within principles and spirit of the disclosure, should be included within the scope of the present disclosure, and the scope of which is defined in the claims and their equivalents.

What is claimed is:

1. A robot arm, comprising:
    an arm body having a first carrying surface and defining a length direction and a width direction; and
    a plurality of adjustment units disposed on both sides of the arm body in the width direction, respectively;
    wherein, each of the plurality of adjustment units comprises: an adjustment rail fixed to the arm body, and an adjustment block being engaged with the adjustment rail and being slidable along the adjustment rail and having a second carrying surface that is parallel to the first carrying surface; and wherein, the adjustment block is movable relative to the adjustment rail such that, the second carrying surface of the adjustment block is adjustable in the width direction between a series of positions from a position where the second carrying surface is within the arm body to a position where the second carrying surface is protruded out of the arm body so that the second carrying surface is adjustable in the width direction.

2. The robot arm of claim 1, wherein, the adjustment block is provided with a sliding groove which matches in shape with the adjustment rail and through which the adjustment block is engaged with the adjustment rail.

3. The robot arm of claim 2, wherein, the adjustment rail has a cross section of inverted isosceles trapezoidal shape, and the sliding groove is a dovetail groove matching with the adjustment rail.

4. The robot arm of claim 2, wherein, the adjustment block comprises a plurality of engagement recesses distributed at intervals in a bottom surface of the sliding groove in the width direction.

5. The robot arm of claim 4, wherein, the arm body further comprises a limiting member, the limiting member has one end fixed to the arm body and the other end acted as a free end, and, the free end is engaged with one of the plurality of engagement recesses when the adjustment block is moved to a preset position, to limit a position of the adjustment block on the adjustment rail.

6. The robot arm of claim 5, wherein, the adjustment block further comprises a guide slide way provided in the bottom surface of the sliding groove in the width direction and communicated with the plurality of engagement recesses, aperture size of the guide slide way is less than aperture size of the engagement recesses, and the free end abuts against the guide slide way during movement of the adjustment block.

7. The robot arm of claim 5, wherein, the limiting member comprises a ball and a spring, and the spring has one end fixed to the arm body and the other end fixed to the ball.

8. The robot arm of claim 1, wherein, the robot arm further comprises:
a plurality of first sucker elements provided at intervals on both edges of the first carrying surface in the width direction, respectively; and
a plurality of second sucker elements provided at intervals on edges, away from the first carrying surface, of the second carrying surfaces of the adjustment members of the plurality of adjustment units, respectively.

9. The robot arm of claim 8, wherein, the first sucker elements and the second sucker elements are sucking discs.

10. The robot arm of claim 1, wherein, the first carrying surface and the second carrying surface each has a rectangular shape.

11. The robot arm of claim 10, further comprising: positioning rods provided at both edges of the first carrying surface in the width direction, respectively, and extending on the arm body in the length direction, and each having a plurality of spaces distributed therein at intervals;
wherein, the plurality of spaces are in a one-to-one correspondence with the plurality of adjustment units so that the plurality of adjustment units are disposed in the plurality of spaces, respectively.

12. The robot arm of claim 11, wherein, in each of the plurality of adjustment units,
two protruding elements are provided at one end of the adjustment block close to the first carrying surface in the length direction;
receiving slits are provided respectively on both sides of each of the plurality of spaces of the positioning rod and match in shape with the two protruding elements and are communicated with the each of the plurality of spaces; and
the protruding elements are moveably engaged in the receiving slits when the adjustment block moves in the space.

13. The robot arm of claim 12, wherein,
the positioning rods each further comprise a plurality of first sheet elements distributed at intervals, a plane in which the plurality of first sheet elements are in is parallel to the first carrying surface, the plurality of first sheet elements each are provided with at least one of the first sucker elements, the plurality of spaces are provided respectively between every two adjacent ones of the plurality of first sheet elements, and the plurality of first sheet elements each are provided with one of the receiving slits near the space; and
the adjustment blocks each further comprise a second sheet element, a plane in which the second sheet element is in is parallel to the second carrying surface, the second sheet element is provided at an edge, away from the first carrying surface, of the second carrying surface of the adjustment block, and the second sheet element is provided with at least one of the second sucker elements.

14. The robot arm of claim 13, wherein,
the first sheet element is formed with a first connection hole and a first vent hole communicated with the first connection hole, and the first sucker element is disposed on the first sheet element through the first connection hole; and
the second sheet element is formed with a second connection hole, and the adjustment block is formed with a second vent hole communicated with the second connection hole, and the second sucker element is disposed on the second sheet element through the second connection hole.

15. The robot arm of claim 14, wherein,
the first connection hole and the second connection hole each are connected with a sucker element connector;
the first sucker element is connected to the first connection hole through the sucker element connector;
the second sucker element is connected to the second connection hole through the sucker element connector; and
the first vent holes and the second vent holes each are connected with a vent connector, and the vent connectors are communicated with one another.

16. The robot arm of claim 1, further comprising: a sensor base disposed on the arm body and configured for placement of a sensor for sensing location of a substrate during operation of the robot arm.

17. A transfer robot, comprising at least one robot arm of claim 1.

* * * * *